(12) United States Patent
Markiewicz

(10) Patent No.: US 7,135,948 B2
(45) Date of Patent: Nov. 14, 2006

(54) DIPOLE SHIM COIL FOR EXTERNAL FIELD ADJUSTMENT OF A SHIELDED SUPERCONDUCTING MAGNET

(75) Inventor: William Denis Markiewicz, Tallahassee, FL (US)

(73) Assignee: Florida State University Research Foundation, Inc., Tallahasse, FL (US)

( * ) Notice: Subject to any disclaimer, the term of this patent is extended or adjusted under 35 U.S.C. 154(b) by 0 days.

(21) Appl. No.: 11/243,530

(22) Filed: Oct. 5, 2005

(65) Prior Publication Data
US 2006/0181381 A1 Aug. 17, 2006

Related U.S. Application Data

(60) Provisional application No. 60/616,083, filed on Oct. 5, 2004.

(51) Int. Cl.
*H01F 7/00* (2006.01)

(52) U.S. Cl. .................. 335/299; 335/301; 324/320

(58) Field of Classification Search ............... 335/216, 335/296–301; 324/318–320
See application file for complete search history.

(56) References Cited

U.S. PATENT DOCUMENTS

| | | | |
|---|---|---|---|
| 6,700,469 B1 * | 3/2004 | Amann et al. | 335/301 |
| 6,781,494 B1 * | 8/2004 | Schauwecker et al. | 335/299 |
| 6,987,436 B1 * | 1/2006 | Frantz | 335/216 |

* cited by examiner

*Primary Examiner*—Ramon M. Barrera
(74) *Attorney, Agent, or Firm*—Senniger Powers

(57) ABSTRACT

An actively shielded superconducting magnet having a dipole shim coil for adjusting and fine-tuning an external or far fringe magnetic field produced by a main coil of the magnet. An active shield coil is coupled to the main coil in reverse polarity and produces a magnetic field when energized that opposes the far fringe field to substantially reduce the far fringe field. The dipole shim coil is electrically isolated from the active shield and main coils of superconducting magnet, and produces a magnetic field when energized that provides for the fine adjustment of any residual far fringe field.

17 Claims, 7 Drawing Sheets

DIPOLE SHIM COIL FOR EXTERNAL FIELD ADJUSTMENT OF A SHIELDED SUPERCONDUCTING MAGNET

CROSS-REFERENCE TO RELATED APPLICATIONS

This application claims the benefit of U.S. Provisional Application No. 60/616,083 filed Oct. 5, 2004.

STATEMENT REGARDING FEDERALLY SPONSORED RESEARCH

This invention was made with Government support under Grant No. DMR0084173 awarded by the National Science Foundation. The Government has certain rights in the invention.

TECHNICAL FIELD

Embodiments of the present invention relate generally to superconducting magnets that are actively shielded and particularly to magnets for use with neutron scattering apparatus and other systems where it is desirable to adjust the residual fringe field to very low values.

BACKGROUND OF THE INVENTION

Strong magnetic fields are used in research and in diagnostic instruments. Magnet applications include Nuclear Magnetic Resonance (NMR), Fourier Transform Ion Cyclotron Resonance (FTICR), materials processing, gyrotrons, neutron diffraction, charge particle beam bending, and medical imaging MRI. Electrical winding magnets of various shapes can be used to produce such strong magnetic fields. For example, the shapes of such electrical winding magnets can range from generally circular to an increasingly racetrack shape. One such high field magnet is a superconducting magnet.

In addition to the magnetic field produced in the center region of such a magnet, which is generally the useful region for the intended purpose of the magnet, a magnetic field is also produced in a region located outside of the windings. This external field is often called the fringe field. The fringe field can be a source of interference with other processes being used in the vicinity of the magnet, including the proper operation of some instrumentation. Moreover, exposure to the fringe field can pose a recognized health hazard for humans. Therefore, methods have been developed for the reduction of the magnitude of the fringe field in the vicinity of high field magnets.

To reduce the fringe field, superconducting magnets have been constructed to include shields. Such shields may be passive or active. Passive shields consist of large quantities of low permeability material such as magnetic steel arranged or placed around the magnet. Active shields consist of a secondary electrical winding, or coil, surrounding the main coil of the magnet at some small but finite distance and operated with a polarity such as to cancel the field outside the combination of main magnet and shield coils.

In principle, there is no limit to the field reduction possible with the application of an active shield. The external field distribution of the main magnet may differ somewhat from that of the shield coil, but at some distance from the device the field distribution will correspond closely to an ideal dipole field. Thus, in an ideal configuration, the fringe field can be eliminated when the dipole moment of the shield coil is caused to be equal in magnitude and opposite in polarity to that of the main magnet.

In practice, however, there are limitations to the precision to which the active shield coil dipole moment is adjusted. The active shield coil is usually operated in series and in opposition with the main magnet, so the electrical energizing current is constrained to be the same. As a result, the dipole moment depends on the size of the shield coil and on the number of winding turns in the coil. Typical manufacturing variations in size or the balance of turns between the main magnet and the shield coil can lead to an imbalance in the dipole moment.

Moreover, the requirements on fringe field reduction from active shield coils are often such that the variations in the dipole moment of the shield coil, and the resulting small differences in the degree to which the fringe field is canceled, are of no practical importance. On the other hand, there are situations in which a very precise cancellation of the fringe field is required, or in which the cancellation must be adjusted by very small amounts from time to time. For these situations, a dipole shim coil may be effectively employed. The magnitude of the field required of the dipole shim coil is small in comparison with the magnitude of the field produced by the main magnet or the shield coil, and a correspondingly small number of windings are typically required. The provision for adjustment of the fringe field is possible because the dipole shim coil is a circuit that is independently energized from the main magnet and shield coil circuit. The coil is therefore properly referred to as a shim coil.

There are other shim coils that are often used together with superconducting magnets, for other purposes. But the dipole shim coil is distinguished by purpose and use. The purpose and required performance is also reflected in the design of the dipole shim coil as compared to shim coils intended for other purposes. The typical shim coils often associated with superconducting magnets are for the purpose of adjusting aspects of the central field including magnitude, variation of magnitude, and uniformity. Shim coils for the adjustment of uniformity are usually so-called gradient coils of various orders. Shim coils for the adjustment of the central field magnitude and time variations have a dipole moment, but the purpose, operation, and design of these coils of the magnet is to affect the central field. Such coils may also be placed on the outside of a main magnet windings due to space limitations on the inside of the magnet, or to benefit from the lower value of the ambient magnetic field on the outside of the magnet. Being a winding that surrounds a larger area than a shim coil inside the magnet, the shim coil on the outside of a magnet will have a larger dipole moment. But the purpose of the shim coils employed to date has been for the adjustment of the central field. In addition, a single coil does not obtain an independent adjustment of the central field and of the external fringe field simultaneously, and therefore the shim coils presently used do not suffice for the far fringe field adjustment of the present invention.

Accordingly, improvements in active shielding, which include allowing fine adjustment of the residual fringe field of an actively shielded superconducting magnet, are desired.

SUMMARY OF THE INVENTION

Aspects of the present invention overcome one or more deficiencies of known superconducting magnets by providing for the fine adjustment of the residual far fringe field of an actively shielded superconducting magnet. In one embodiment, the invention can be used in situations that require a precise cancellation of the far fringe field, or situations where an adjustment of the far fringe field is required. A dipole shim coil eliminates the need for additional external coils to adjust the environmental field. If desired, the dipole shim coil may be ramped together with the shielded magnet to provide control of the far field at all times during magnet operation. The dipole shim coil in one embodiment operates at low current on a separate power supply, and can be placed in persistent mode when the magnet is in persistent mode to reduce helium consumption.

In accordance with one aspect of the invention, an actively shielded superconducting magnet includes a main coil having a central axis and a shield coil having a central axis that is generally parallel to the central axis of the main coil. The main coil produces a central magnetic field and a far fringe field when energized. The shield coil is positioned substantially concentrically outside of the main coil and produces an opposing magnetic field for substantially reducing the far fringe field when energized. The magnet also includes a dipole shim coil having a central axis that is generally parallel to the central axes of the main and shield coils. The dipole shim coil is positioned substantially concentrically outside of the main coil and is positioned substantially coaxially with the shield coil and produces a magnetic field for adjusting and fine-tuning the far fringe field that has been substantially reduced by the opposing magnetic field of the shield coil when energized.

In accordance with another aspect of the invention, an apparatus is provided for adjusting and fine-tuning a first magnetic field being produced by a magnet. The apparatus includes a first coil having a central axis and a second coil having a central axis that is generally parallel to the central axis of the first coil. The first coil is nested within the second coil and the coils are electrically coupled to each other. The first coil has a first dipole moment when energized by a current received from a first power supply. The first dipole moment indicates a magnitude of the first magnetic field being produced outside of the first coil. The second coil has a second dipole moment that is substantially equal in magnitude and opposite in polarity to the first dipole moment when energized. The second dipole moment corresponds to a magnitude of a second magnetic fringe field that substantially cancels the first magnetic fringe field. The apparatus further includes a third coil having a central axis generally parallel to the central axes of the first and second coils and is nested within the second coil but outside of the first coil. The third coil has a third dipole moment when energized by a current received from a second power supply. The third dipole moment corresponds to a magnitude of a third magnetic fringe field that adjusts and fine-tunes the first and second magnetic fringe fields.

In accordance with another aspect of the invention, a method is provided for adjusting and fine-tuning a far fringe magnetic field being generated by an actively shielded superconducting magnet. The method includes producing an opposing magnetic field for substantially reducing the far fringe field by the use of a shield coil. The method further includes producing a further magnetic field for adjusting and fine-tuning the fringe field that has been substantially reduced by the opposing magnetic field.

In accordance with yet another aspect of the invention, an actively shielded superconducting magnet includes a main coil having a central axis and a shield coil having a central axis that is generally parallel to the central axis of the main coil. The main coil produces a central magnetic field and a far fringe field when energized. The shield coil is positioned substantially concentrically outside of the main coil and produces a first opposing magnetic field for substantially reducing the far fringe field when energized. The shield coil is energized via a first electrical path to produce the opposing magnetic field and is energized via a second electrical path for producing a second magnetic field for adjusting and fine-tuning the far fringe field that has been substantially reduced by the opposing magnetic field.

Alternatively, the invention may comprise various other methods and systems.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION OF PREFERRED EMBODIMENTS

Figure 1:
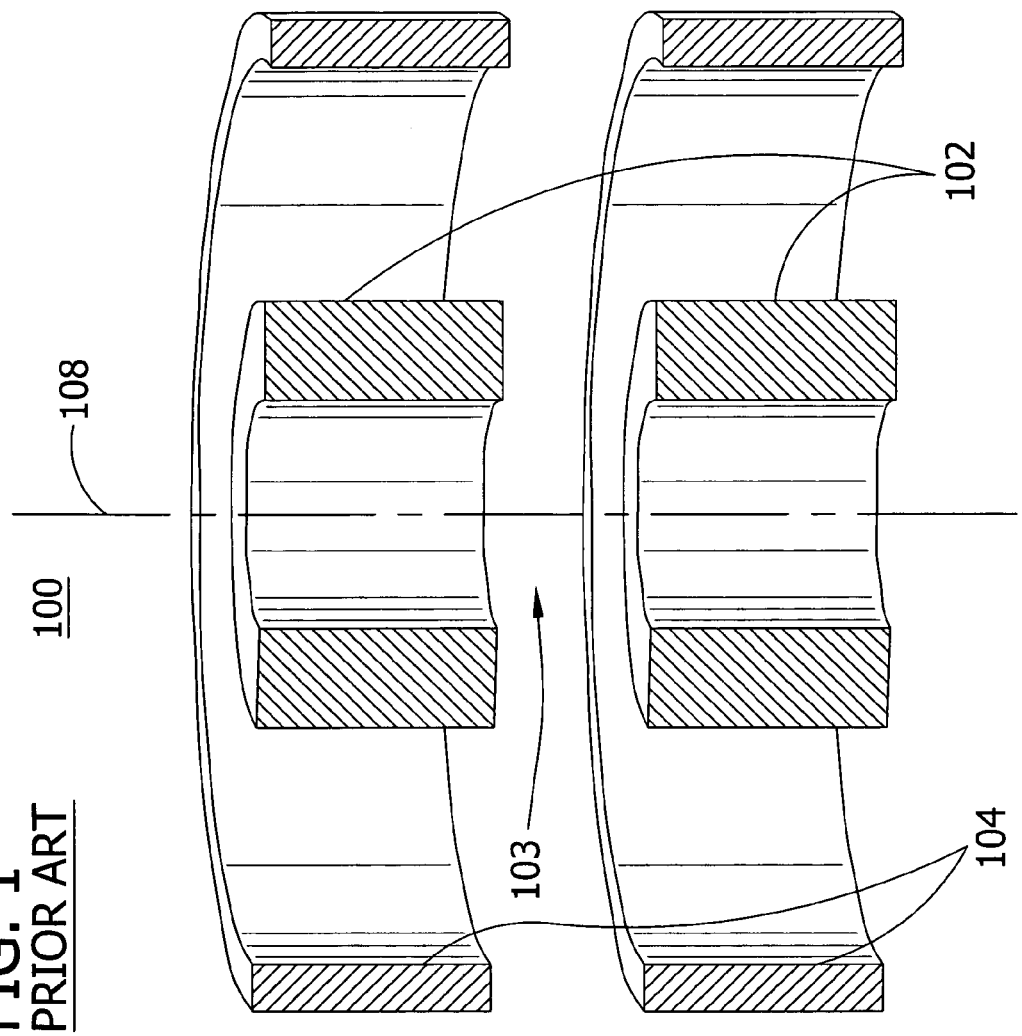
FIG. 1 illustrates a partial cross-sectional view of an actively shielded superconducting magnet in accordance with the prior art.
Figure 2:
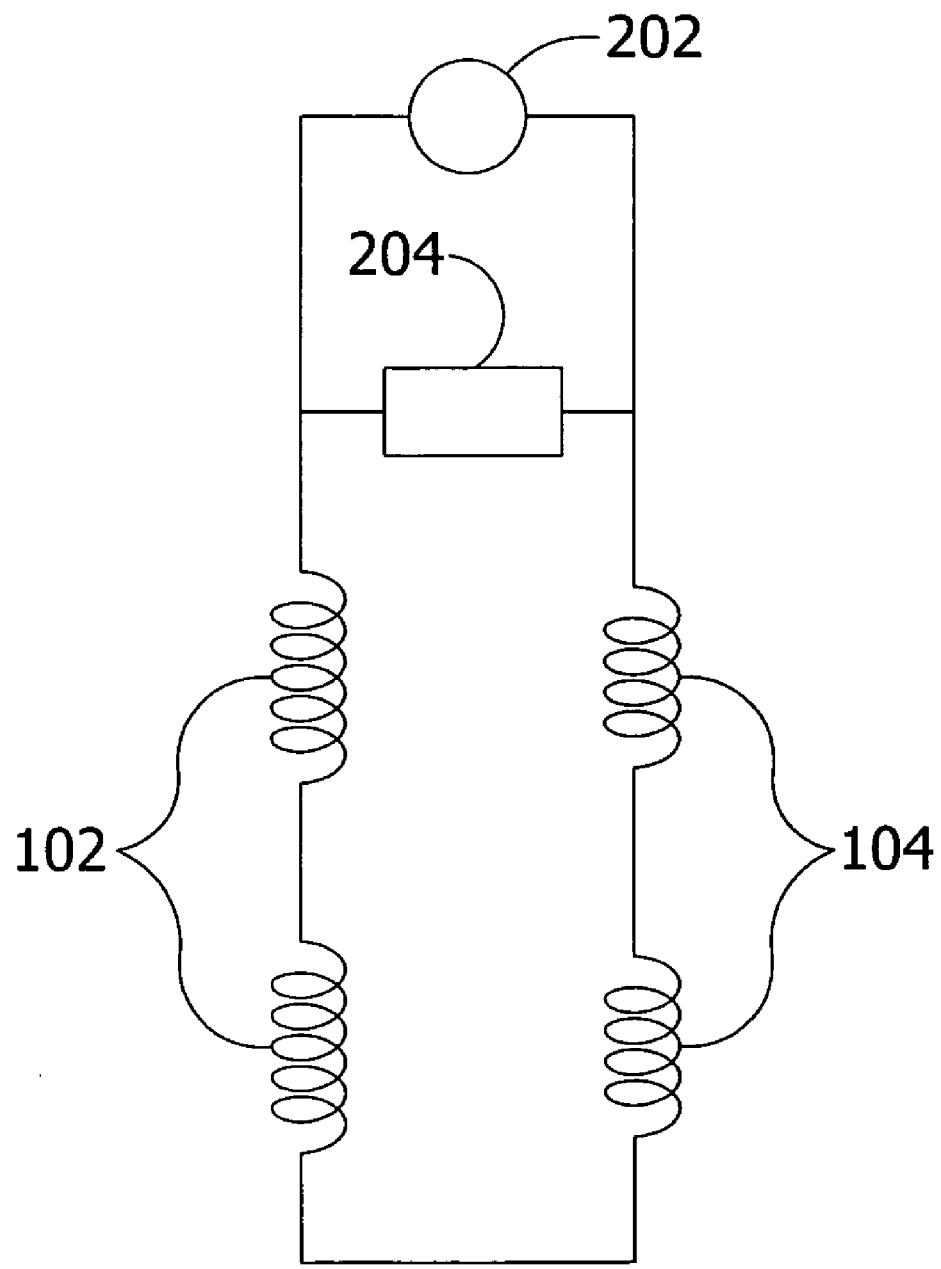
FIG. 2 is a schematic diagram illustrating components of an electrical circuit for powering the actively shielded superconducting magnet of FIG. 1.

Referring now to the drawings, FIG. 1 shows a cross-sectional view of an actively shielded superconducting magnet 100. The actively shielded magnet 100 includes, for example, two inner main coils 102 for producing a relatively strong central magnetic field in the magnet bore 103, which results in a far fringe field. FIG. 1 also illustrates two outer shield coils 104 for the purpose of substantially reducing the far fringe field. The main coils 102 and shield coils 104 are operated in the same cold space and are mechanically and electrically connected. Referring briefly to FIG. 2, a schematic diagram illustrates the components of an electrical circuit 200 for powering the actively shielded superconducting magnet 100. The main coils 102 are connected in series with the shield coils 104 and are operated by a common power supply 202. A switch 204 connected in series with main coils 102 and shield coils 104 allow the coils 102, 104 to be selectively operated in a persistent mode or a non-persistent mode. The switch 204 is closed and superconducting when cold, and provides an essentially fully superconducting and, therefore, persistent current path for the magnet. When switch 204 is heated above the superconducting critical temperature, it has a high resistance and forces the current path through the power supply 202. The magnet 100 then operates in powered or non-persistent mode. Although shield coils 104 are operated electrically in series with the main coils 102, the shield coils 104 are operated magnetically in opposition to the main coils 102. As a result, the far fringe field produced by the main coils 102 and the far fringe field produced by the shield coils 104 oppose each other, and the far fringe field of the main coils 102 is substantially reduced. More specifically, the far fringe fields of the main coils 102 and shield coils 104 are substantially canceled when the dipole moments of the main and shield coils 102, 104 are of equal magnitude and opposite polarity.

Referring back to FIG. 1, the main coils 102 and shield coils 104 are arranged generally coaxially with respect to a central axis 108. The shield coils 104 have an increased radius, as compared to the main coils 102, to provide as much dipole moment from the increased area within the coil 104 in order to limit the required ampere-turns. In this way, the reduction in the central magnetic field resulting from the shield coils 104 is minimized. In this particular example, the length of each of the shield coils 104 is substantially the same length as each of the main coils 102. In general, however, the shielding performance of each of the shield coils 104 is less dependent on the particular selection of diameter and/or length of the coils 104 and more dependent on the dipole moment provided by the shield coils 104. Nevertheless, there are practical limits to the degree to which the dipole moment of the main coils 102 can be canceled by the shield coil 104. For example, the number of turns required in shield coil 104 depends on the detailed dimensions of all of the coils in the main coil 102, and the number of turns in the main coil 102, in addition to the detailed dimensions of the shield coil 104. Uncertainty in fabrication dimensions and as built numbers of turns can lead to an imbalance in the dipole moment between main coil 102 and shield coil 104, and thereby limit the ability of the shield coils 104 to cancel the far fringe field to the extent that may be desirable or necessary for the intended use.

The superconducting magnet 100 is often operated in an environment containing significant quantities of magnetic materials. These materials may be associated with control instrumentation, experimental equipment or a part of the supporting structure of the magnet 100 itself. The active shield coils 104 substantially reduce the far fringe field and thereby reduce the interaction of forces between the magnet 100 and the nearby magnetic materials. However, as described above, the shield coils 104 may not totally cancel the far fringe field, and, thus, there is some residual amount of the far fringe field that remains. This residual far fringe can still cause the magnetization of magnetic materials within the operating environment and/or cause further uncertainty in the fringe field. In fact, only a relatively small absolute fringe field value and/or small change in the fringe field value is necessary to adversely impact instrumentation or equipment having such magnetic materials. For example, an absolute fringe field value on the order of the earth's magnetic field, or less, can adversely impact such instrumentation or equipment. Thus, minimizing the fringe field with respect to the placement and operation of instrumentation near and not so near to the magnet 100 is of significant importance in obtaining optimal use of the magnet 100.

Figure 3:
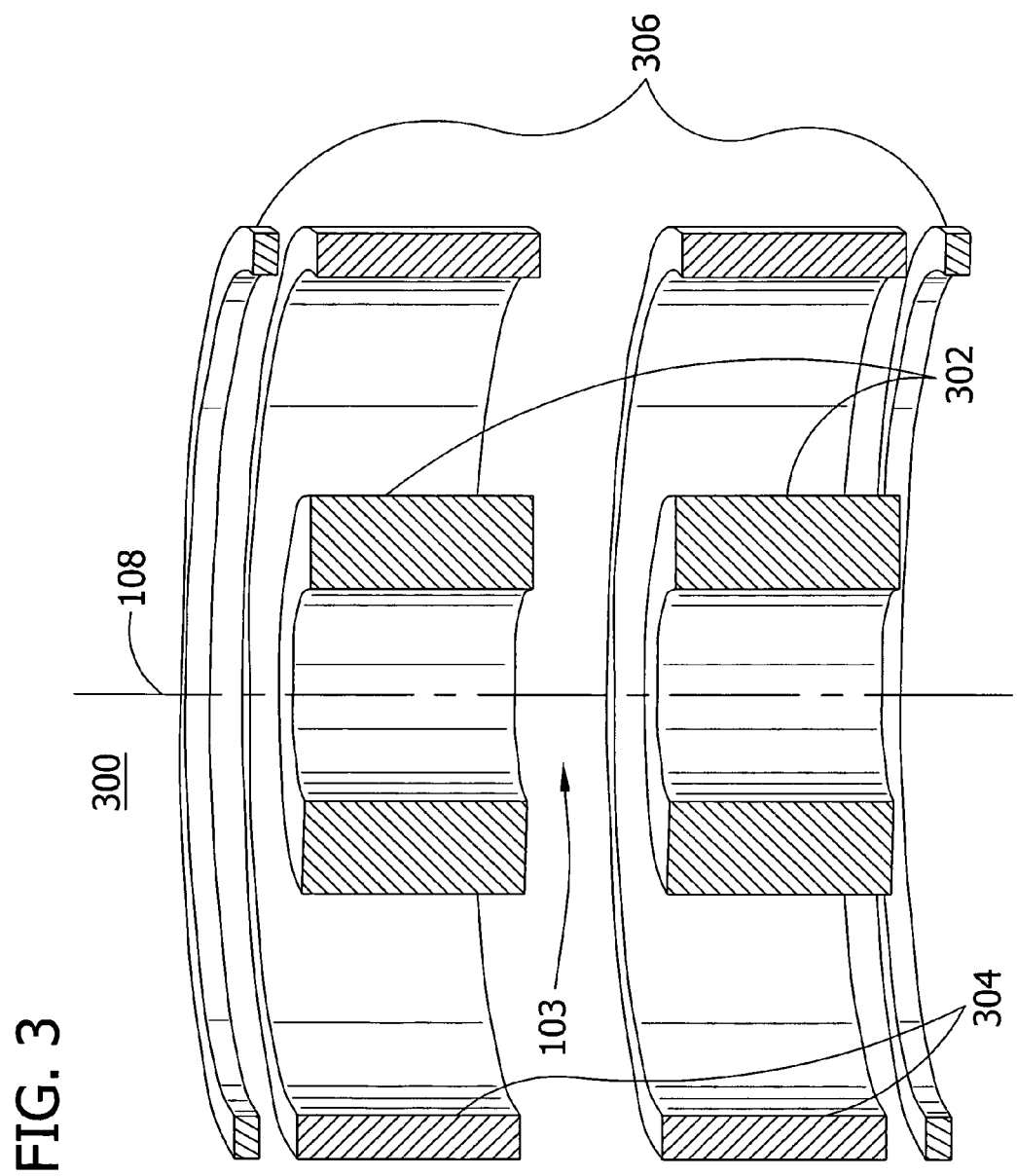
FIG. 3 illustrates a partial cross-sectional view of an actively shielded superconducting magnet having a dipole shim coil in accordance with one exemplary embodiment of the invention.

Referring now to FIG. 3, there is shown a partial cross-sectional view of an actively shielded superconducting magnet 300 according to one preferred embodiment of the invention. In this embodiment, the actively shielded magnet 300 includes at least one inner main coil 302 (e.g., two inner main coils) that produces a strong central magnetic field in the magnet bore 103 and a far fringe field. In addition, the magnet 300 includes at least one outer shield coil 304 (e.g., two outer shield coils) for substantially reducing the far fringe field and at least one dipole shim coil 306 (e.g., two dipole shim coils) for adjusting and fine tuning the far fringe field that has largely been reduced (e.g., residual far fringe field) by the shield coils 304. Although FIG. 3 illustrates a pair of main coils 302, a pair of shield coils 304, and a pair of dipole shim coils 306, for purposes of illustration the invention is described herein in reference to the operation of a single main, shield, and dipole shim coil since the performance of each the coils in a particular pair is substantially the same. The inner main coil 302 and the outer shield coil 304 are positioned as described above in reference to FIG. 1 (e.g., arranged generally coaxially with respect to the central axis 108). In this embodiment, the dipole shim coil 306 is positioned outside of the main coil 302, and is positioned concentrically and coaxially with the main and shield coils 302, 304. In one embodiment, the dipole shim coil 306 is a relatively small electrical winding coil designed to efficiently produce a dipole moment for the number of turns and operating current employed. Such performance optimization is achieved by using a relatively large area enclosed by the windings. Given design constraints when constructing a superconducting magnet, a suitable location for the dipole shim coil 306 is at the diameter of the shield coil 304. In this particular embodiment, the dipole shim coil 306 is located at the ends of the shield coil 304. Using a larger diameter for the dipole shim coil 306 would require additional space within a cryogenic enclosure (not shown) that houses and cools the superconducting magnet 300 and would likely be cost prohibitive. Smaller diameters are entirely possible, but result in a less efficient dipole shim coil 306.

Figure 4:
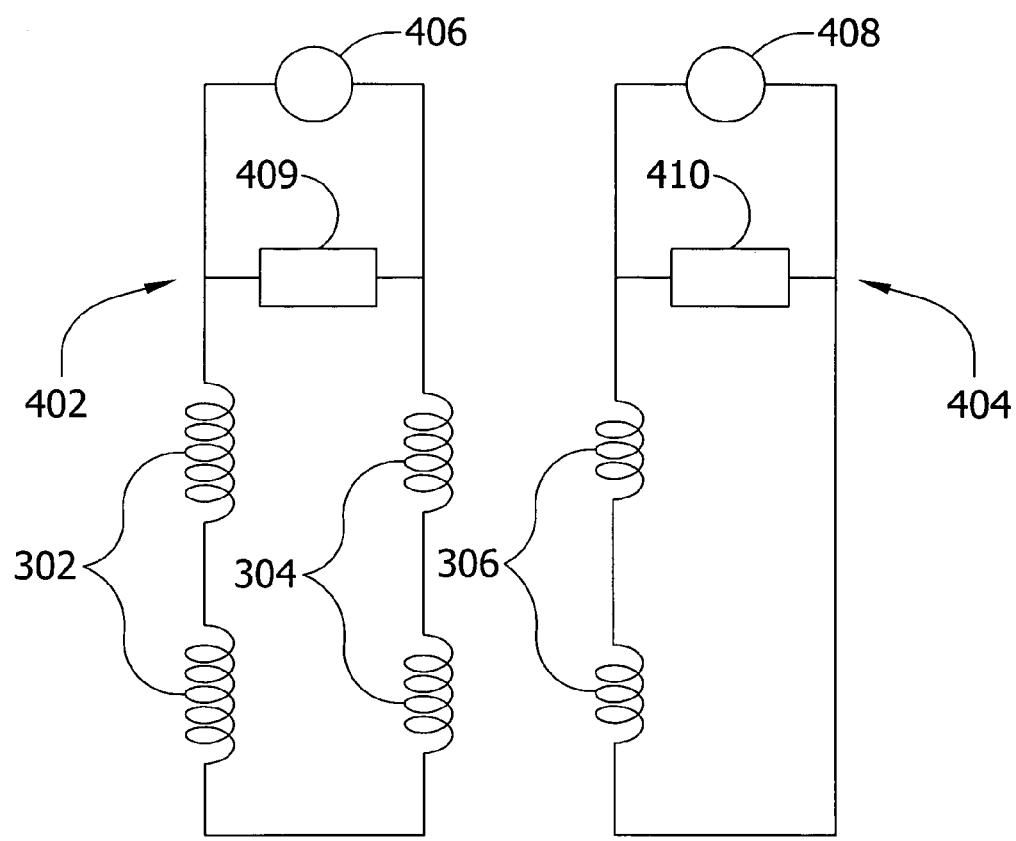
FIG. 4 is a schematic diagram illustrating components of an electrical circuit for powering the actively shielded superconducting magnet of FIG. 3.

Referring now to FIG. 4, a schematic diagram illustrates a circuit 400 for powering the superconducting magnet 300. In this embodiment, the dipole shim coil 306 is energized via a separate electrical path from that of the main coil 302 and the shield coil 304. As a result, the dipole shim coil 306 can be adjusted independently of the main coil 302 and shield coil 304 in order to fine-tune or adjust the residual fringe field. This separate electrical path can be achieved by using entirely physically separate circuits. For example, a main coil circuit 402 includes the main coil 302 connected in series with the shield coil 304 and is operated from a first power supply 406. A separate dipole shim coil circuit 404 includes the dipole shim coil 306 and is operated by a second power supply 408. The current in the dipole shim coil 306 can be supplied in either polarity, to increase or decrease the far fringe field. A first persistent switch 409 (e.g., switch 204) connected in series with the main coils 302 and shield coils 304 allow the coils 302, 304 to be selectively operated in a persistent mode or a non-persistent mode, and a second persistent switch 410 connected to the dipole shim coil 306 allow the coil 306 to be selectively operated in a persistent mode or a non-persistent mode. The dipole shim 306, described in reference to FIGS. 3 and 4, is designed to provide a dipole moment without consideration of interaction with the main coil 302 and shield coil 304. In more advanced designs, however, it is possible to limit the inductive coupling between the dipole shim coil 306 and the main coil 302 for the purpose of protection of the dipole shim coil 306.

Figure 5:
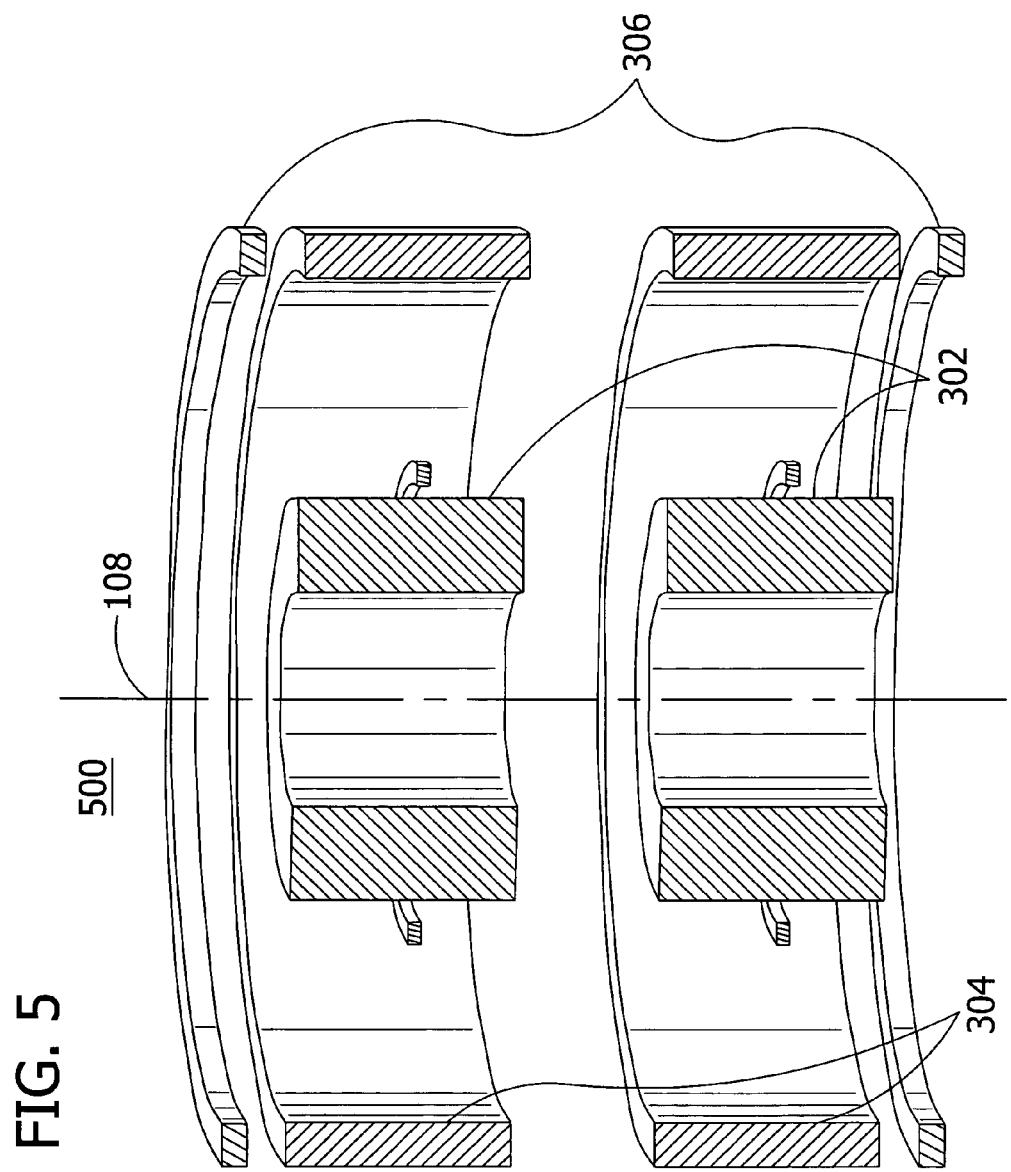
FIG. 5 illustrates a partial cross-sectional view of advanced actively shielded superconducting magnet having a dipole shim coil in accordance with one exemplary embodiment of the invention.
Figure 6:
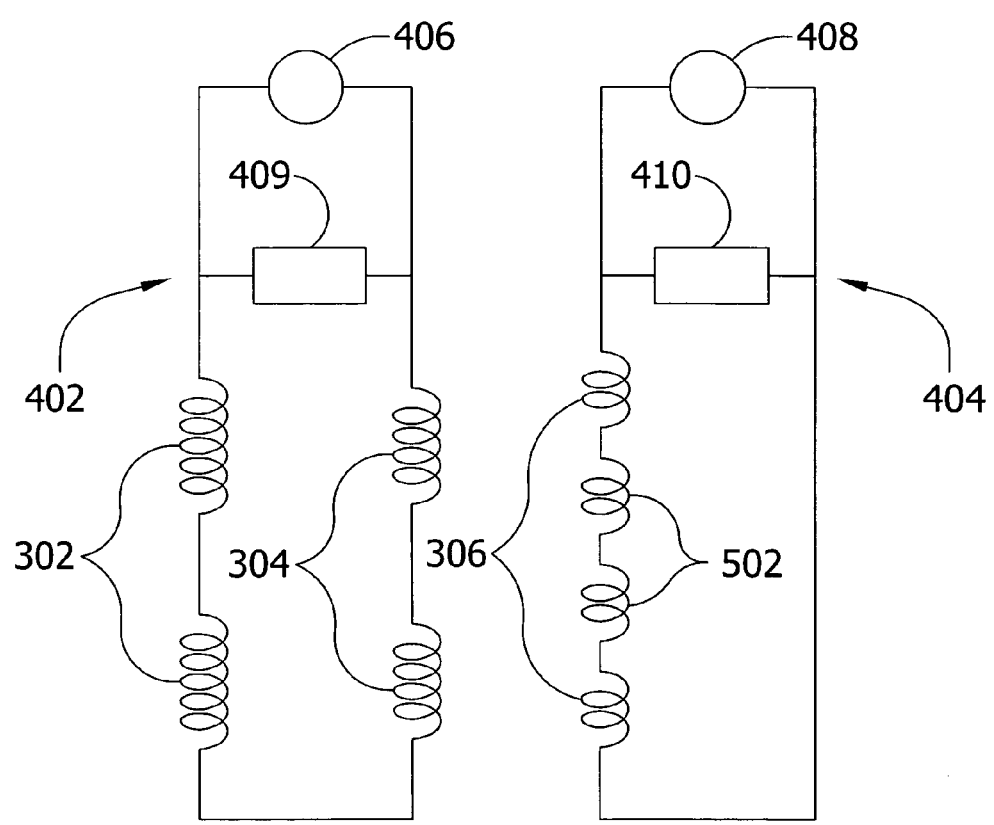
FIG. 6 is a schematic diagram illustrating components of an electrical circuit for powering the actively shielded superconducting magnet of FIG. 5.

Referring now to FIG. 5, a partial cross-sectional view of an advanced design for an actively shielded superconducting magnet 500 is shown. In this embodiment, an additional shim coil 502 is positioned directly outside of the main coil 302 and inside of the shield coil 304. Notably, the additional coil 502 can also be placed at other locations. The additional coil 502 has a different value of mutual inductance to the combination of the main coil 302 and shield coil 304 than does the primary dipole shim coil 306, and may have a different number of turns and an opposite polarity as compared to the primary dipole shim coil 306. Referring now to FIG. 6, components of a circuit 600 for powering such an advanced design of the actively shielded superconducting magnet 500 are shown. This advanced circuit 600 is substantially the same as the circuit 400 described above in reference to FIG. 4, except circuit 600 includes additional shim coils 502 that are connected in series with the dipole shim coils 306 in the dipole shim coil circuit 404.

Figure 7:
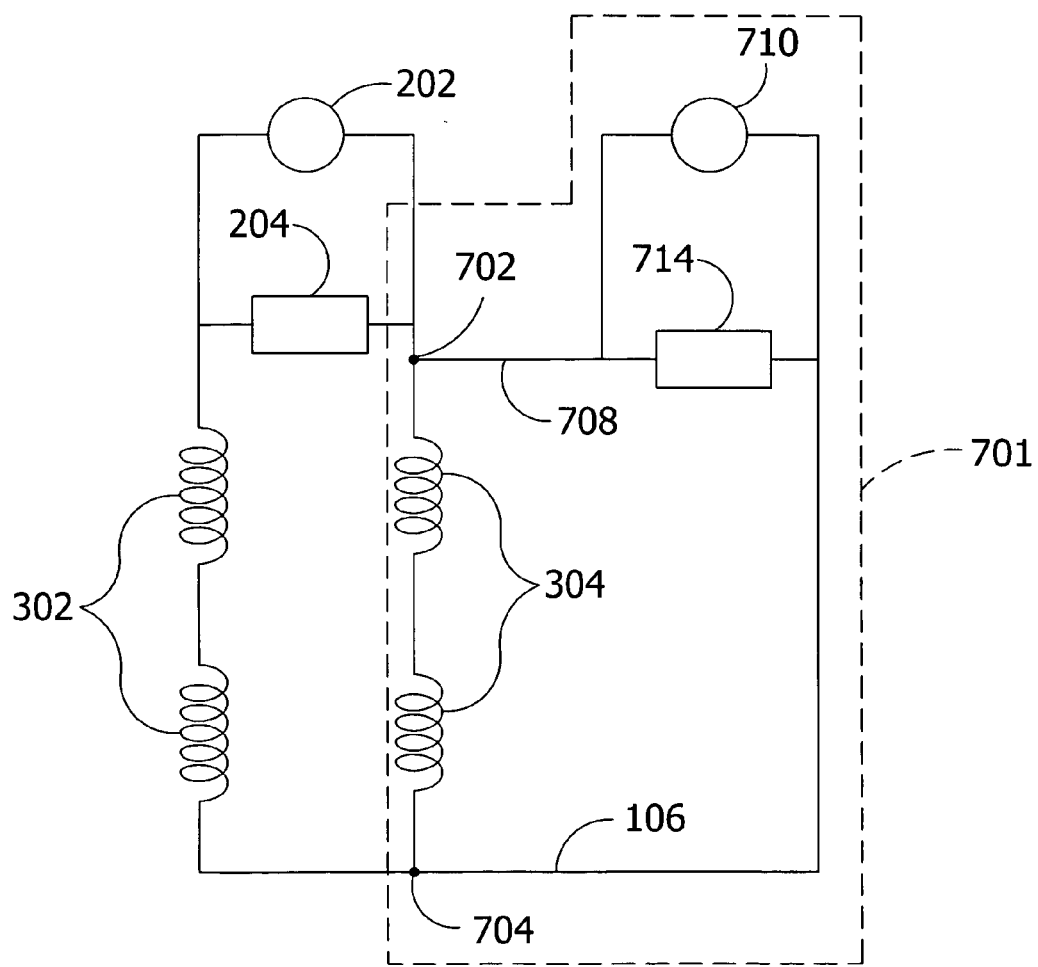
FIG. 7 is a schematic diagram illustrating components of an electrical circuit for powering the actively shielded superconducting magnet having an effective dipole shim in accordance with aspects of the invention.

Referring now to FIG. 7, a schematic diagram illustrates another circuit 700 for powering a superconducting magnet, such as superconducting magnet 300. In this embodiment, an effective dipole shim coil 701 is achieved by using the windings of the shield coil 304 of circuit 200 shown in FIG. 2 to create a separate electrical path. As used herein, the terms "effective dipole shim coil" denote that the benefits of a dipole shim coil 304 can be achieved in a shielded magnet without adding a separate physical coil structure. For example, a separate electrical path is created by connecting leads 706, 708 to the shield coils 304 via electrical taps 702, 704, respectively. As a result, the same coils are used for substantially reducing the far fringe field and for adjusting and fine-tuning the far fringe field that has been substantially reduced. A second power supply 710 provides current to the shim coil 306 via leads 706, 708, and is controlled independently of the current being supplied from the first power 202 supply to the main coil 302 and shield coil 304. The current being supplied to the shim coil 306 may be supplied in either polarity, with the effect of increasing or decreasing the dipole moment of the shield coil 304. A persistent switch 714 allows the effective shim coil 306 to be operated in persistent mode.

The order of execution or performance of the methods illustrated and described herein is not essential, unless otherwise specified. That is, it is contemplated by the inventor that elements of the methods may be performed in any order, unless otherwise specified, and that the methods may include more or less elements than those disclosed herein. For example, it is contemplated that executing or performing a particular element before, contemporaneously with, or after another element is within the scope of the invention.

When introducing elements of the present invention of the preferred embodiments thereof, the articles "a," "an," "the," and "said" are intended to mean that there are one or more of the elements. The terms "comprising," "including," and "having" are intended to be inclusive and meant that there may be additional elements other than the listed elements.

In view of the above, it will be seen that the several objects of the invention are achieved and other advantageous results attained.

As various changes could be made in the above constructions and methods without departing from the scope of the invention, it is intended that all matter contained in the above description and shown in the accompanying drawings shall be interpreted as illustrative and not in a limiting sense.

What is claimed is:

1. An actively shielded superconducting magnet comprising:
   at least one main coil having a central axis, said main coil producing a central magnetic field and a far fringe field when energized;
   at least one shield coil having a central axis generally parallel to the central axis of the main coil, said shield coil being positioned substantially concentrically outside of the main coil and producing an opposing magnetic field when energized for substantially reducing the far fringe field; and
   at least one dipole shim coil having a central axis generally parallel to the central axes of the main and shield coils, said dipole shim coil being positioned substantially concentrically outside of the main coil and producing an additional magnetic field when energized for adjusting and fine-tuning the far fringe field that has been substantially reduced by the first magnetic field of the shield coil, and wherein the main coil has a first radius and the shield coil and dipole shim coil have a second radius, said second radius being greater than the first radius.

2. The magnet of claim 1, wherein the shield coil is energized via a first electrical path and the dipole shim coil is energized via a second electrical path for adjusting the additional magnetic field independently of the opposing magnetic field.

3. The magnet of claim 1, wherein a first power supply supplies a first current for energizing the main coil and the shield coil, and wherein a second power supply supplies a second current for energizing the dipole shim coil.

4. The magnet of claim 3, wherein the dipole shim coil is responsive to the second current having a first polarity to increase the far fringe field and responsive to the second current having a second polarity to decrease the far fringe field, said second polarity being reversed as compared to the first polarity.

5. The magnet of claim 3, further comprising a first circuit including the main coil, the shield coil and the first power supply and a second circuit including the dipole shim coil and the second power supply, said first circuit operating independently of the second circuit.

6. The magnet of claim 5, wherein the main coil is connected in series with the shield coil in the first circuit.

7. The magnet of claim 5, wherein the first circuit includes a first switch for selectively operating the main coil and the shield coil in a persistent mode, and wherein the second circuit includes a second switch for selectively operating the dipole shim coil in a persistent mode.

8. The magnet of claim 1, wherein the at least one dipole shim coil comprises a first dipole shim coil, and further comprising a second dipole shim coil having a central axis generally parallel to the central axes of the main, shield, and first dipole shim coils, said second dipole shim coil being positioned substantially concentrically outside of the main coil and positioned substantially concentrically within the shield coil and first dipole shim coil to substantially reduce inductive coupling between the first dipole shim coil and the main coil.

9. The magnet of claim 8, wherein the second dipole shim coil has a mutual inductance to a combination of the main and shield coils that is different from a mutual inductance of the first dipole shim coil to the combination of the main and shield coils, and wherein the second dipole shim coil has a different number of turns in coil windings as compared to a number of turns in coil windings of the first dipole shim coil and an opposite polarity as compared to a polarity of the first dipole shim coil.

10. An apparatus for adjusting and fine-tuning a far fringe magnetic field being produced by a magnet, said magnet comprising:
    a first coil having a central axis, said first coil having a first dipole moment when energized, said first dipole moment indicating a magnitude of the far fringe magnetic field being produced outside of the first coil; and a second coil having a central axis generally parallel to the central axis of the first coil and being positioned substantially concentrically outside of the first coil and electrically coupled to the first coil, said second coil having a second dipole moment being substantially equal in magnitude and opposite in polarity to the first dipole moment when energized, said second dipole moment corresponding to a magnitude of a second magnetic field that substantially reduces the far fringe magnetic field; and said apparatus comprising:

a third coil having a central axis generally parallel to the central axes of the first and second coils and positioned substantially concentrically outside of the first coil and positioned substantially coaxially with the second coil, said third coil having a third dipole moment when energized, said third dipole moment corresponding to a magnitude of a third magnetic field that adjusts and fine-tunes the reduced far fringe magnetic field; and a fourth coil having a central axis generally parallel to the central axes of the first, second, and third coils, said fourth coil being positioned substantially concentrically outside of the first coil and positioned substantially concentrically within the second coil and third coil to substantially eliminate inductive coupling between the third coil and the first coil, and wherein the fourth coil comprises:

a different mutual inductance value to a combination of the first and second coils as compared to a mutual inductance value of the third coil to the combination of the first and second coils;

a different number of turns in coil windings as compared to a number of turns in coil windings of the third coil; and an opposite polarity as compared to a polarity of the third coil.

11. The apparatus of claim 10, wherein the third coil is energized via a first electrical path and wherein the second coil is energized via a second electrical path to adjust the third magnetic field independently of the second magnetic field for adjusting and fine-tuning the reduced far fringe magnetic field.

12. The apparatus of claim 10, further comprising a first power supply supplying a first current for energizing the first coil and the second coil, and a second power supply supplying a second current for energizing the third coil.

13. The apparatus of claim 12, wherein the third coil is responsive to the second current having a first polarity to increase the reduced far fringe field and responsive to the second current having a second polarity to decrease the reduced far fringe magnetic field, said second polarity being opposite to the first polarity.

14. The apparatus of claim 12, wherein the first coil, second coil and first power supply are components of a first circuit, and the third coil and second power supply are components of a second circuit, and wherein the first circuit operates independently of the second circuit.

15. An actively shielded superconducting magnet comprising:

a main coil having a central axis, said main coil producing a central magnetic field and a far fringe field when energized; and a shield coil having a central axis generally parallel to the central axis of the main coil, said shield coil being positioned substantially concentrically outside of the main coil and producing a first magnetic field when energized for substantially reducing the far fringe field, said shield coil being energized via a first electrical path to produce the first magnetic field, and said shield coil being energized via a second electrical path for producing a second magnetic field for adjusting and fine-tuning the far fringe field that has been substantially reduced by the first magnetic field.

16. The magnet of claim 15, wherein a first power supply supplies a first current for energizing the main coil and the shield coil via the first electrical path, and wherein a second power supply supplies a second current for energizing the shield coil via the second electrical path.

17. An actively shielded superconducting magnet comprising:

at least one main coil having a central axis, said main coil producing a central magnetic field and a far fringe field when energized;

at least one shield coil having a central axis generally parallel to the central axis of the main coil, said shield coil being positioned substantially concentrically outside of the main coil and producing an opposing magnetic field when energized for substantially reducing the far fringe field;

a first dipole shim coil having a central axis generally parallel to the central axes of the main and shield coils, said dipole shim coil being positioned substantially concentrically outside of the main coil and producing an additional magnetic field when energized for adjusting and fine-tuning the far fringe field that has been substantially reduced by the first magnetic field of the shield coil; and a second dipole shim coil having a central axis generally parallel to the central axes of the main coil, the shield coil, and the first dipole shim coil, said second dipole shim coil being positioned substantially concentrically outside of the main coil and positioned substantially concentrically within the shield coil and the first dipole shim coil to substantially reduce inductive coupling between the first dipole shim coil and the main coil, said second dipole shim coil having a mutual inductance to a combination of the main shield and the shield coil that is different from a mutual inductance of the first dipole shim coil to the combination of the main and shield coils, second dipole shim coil further having a different number of turns in coil windings as compared to a number of turns in coil windings of the first dipole shim coil and an opposite polarity as compared to a polarity of the first dipole shim coil.

* * * * *